United States Patent [19]

Scholl et al.

[11] 4,358,723

[45] Nov. 9, 1982

[54] METHOD AND APPARATUS FOR MEASURING THE ROTATION OF A WORK TABLE

[76] Inventors: Jule A. Scholl, Clove Rd., Verbank, N.Y. 12585; Paul F. Fitts, Smithfield Rd., Millerton, N.Y. 12546

[21] Appl. No.: 182,764

[22] Filed: Aug. 29, 1980

[51] Int. Cl.³ .............................................. G05B 1/06
[52] U.S. Cl. .............................. 318/661; 340/347 SY
[58] Field of Search ............................... 318/656–661; 340/347 SY

[56] References Cited

U.S. PATENT DOCUMENTS 3,562,740  2/1971  Watkins .............................. 318/661

*Primary Examiner*—B. Dobeck
*Attorney, Agent, or Firm*—Brumbaugh, Graves, Donohue & Raymond

[57] ABSTRACT

A device for measuring the rotation of a member includes an angular error sensor having a movable sensor element connected to the rotatable member and a pair of guadrature-spaced stationary elements for inducing the error in the sensor element. A detector measures the polarity and amplitude of the error and delivers it to a processor that accumulates successive error signals. The accumulated signal is averaged, corrected and displayed as the measurement. Also the accumulated signal is used to control a set of multiplier devices that create different driving signals from a single signal source for application to the guadrature elements of the error sensor. The output of these multiplier devices is controlled by the processor such that the error signal is driven toward zero.

20 Claims, 6 Drawing Figures

MDAC CONTROL LOGIC

METHOD AND APPARATUS FOR MEASURING THE ROTATION OF A WORK TABLE

BACKGROUND OF THE INVENTION

This invention relates to a method and apparatus for measuring the rotation of a work table and, more particularly, to the production of a digital readout of the position of such a table.

Resolvers are well known devices for measuring the linear or rotary displacement of a member. The principles of these devices are explained, for example, in U.S. Pat. No. 2,799,835 to Tripp et al., U.S. Pat. No. 2,867,783 to Childs and U.S. Pat. No. 2,915,721 to Farrand et al., which are incorporated herein by reference. The basic circuit arrangement for rotary measurements consists of a set of quadrature windings which are spaced 90° from each other, and a sensor winding which rotates in close proximity to the quadrature windings. The sensor winding is attached to the member whose angular displacement $\theta'$ is to be measured. If currents in the relation of sine $\phi$ and cosine $\phi$ are supplied to the quadrature windings, there will be a particular position of the sensor winding where the current induced therein from the quadrature windings is zero, i.e. when $\theta = \phi$. In all other positions e.g. $\theta'$, an error current will be detected which can be measured or used in a feedback circuit to vary the sine and cosine inputs until a null is achieved, i.e. $\phi$ is changed until it equals $\theta$. The change needed to vary the sine and cosine functions is an indication of the rotation from the position $\theta$ to the position $\theta'$.

The sine and cosine function can be generated by applying the output of a signal generator to two multiplying digital to analog converter (MDAC) units. The multiplying factor for the MDAC units is determined in response to the error signal such that one unit produces a sine function and the other produces a cosine function of the angular position where a null is achieved.

In order to improve the accuracy of the resolver, multiple poles can be used instead of a single pole. As a result, a motion from one pole position to another will represent only a small part of one revolution of the mechanical member being rotated. Such multi-pole resolvers must be manufactured with a high degree of accuracy in order to produce accurate measurements. Also the sine and cosine MDAC units must accurately produce sine and cosine functions. As a result, prior art multi-pole resolvers are expensive and difficult to manufacture.

SUMMARY OF THE INVENTION

The present invention is directed to a method and apparatus for measuring angular displacement by inexpensive and simple means. These objects are achieved by establishing a feedback path for a multi-pole resolver that utilizes linear MDAC units to drive the quadrature windings, instead of sine-cosine MDAC units, and a processor for inserting the sine-cosine conversion into the signal. In addition the processor may be designed to insert corrections into the signal to account for manufacturing inaccuracies in the resolver, thus eliminating the need for close tolerances in the manufacture of the resolver.

An illustrative embodiment of the invention has the sensor winding of the resolver connected to the input of a circuit which detects the error signal and determines its polarity. The amplitude and sign of the error are fed to a microprocessor, which in turn generates the control signals for the linear MDAC units. Basically, the control signals are generated by analyzing the contents of a raw data counter that are incremented by a fixed step in a direction to reduce the error. The signal input to each MDAC unit is from a high frequency signal generator, and the outputs of the MDAC units are applied to the quadrature windings of the resolver. Thus the error signal continually updates the raw data counter in the microprocessor which interprets this data and controls the multiplication factor of the MDAC unit so as to reduce the error to zero.

When the unit is turned on, or at the direction of the operator, the raw data counter in the microprocessor is set to zero. As previously mentioned, when rotation of the work table and sensor windings produces error signals, they are used to update the raw data counter. The contents of this counter are averaged and are used to address a linearization table in the microprocessor. The addressed value in the table is added to the average signal to create a linearized signal. This table is needed because the MDAC units are linear, while the true quadrature winding signal should be a sine-cosine function. Because of the feedback loop the error is still driven to zero, but the raw data count is off. The linearized signal is converted to the correct format and is used to drive a readout for displaying the angular position of the work table.

In a preferred embodiment of the invention the linearization table represents 64 points along a quadrant of a pole cycle, and linear interpolation is made between the points. The linearization correction is repeated for each of the other three quadrants of the pole cycle. Also, the microprocessor controls the MDAC units according to a trapezoidal function, wherein one unit is held constant at either the maximum or minimum level, while the other is increased or decreased. The angular position of the work table, i.e. the raw data counter number, determines which MDAC is held constant and which is incremented.

In a still further embodiment of the invention, after the averaging counter signal has been linearized, a correction from a table representing the inherent error of the sensor, is added. To determine the error to be added, a once-per-revolution indicator must be included. The linearized and corrected signal can then be converted into a display of degrees, minutes and seconds or degrees and thousandths.

BRIEF DESCRIPTION OF THE DRAWINGS

The foregoing and other features of the present invention will be more readily apparent from the following detailed description of an illustrative embodiment of the invention, together with the drawings in which.

DESCRIPTION OF AN ILLUSTRATIVE EMBODIMENT

Figure 1:
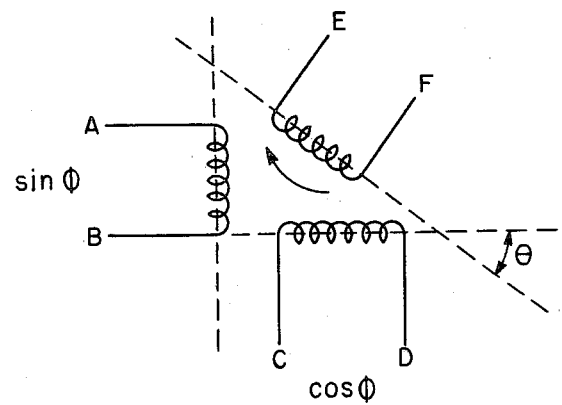
FIG. 1 represents the general arrangement of a single pole resolver.

The single pole resolver shown in FIG. 1 has a 0° winding A,B to which a signal, sine $\phi$, is applied. Spaced 90° from winding A,B is a second or 90° winding C,D which has the signal cosine $\phi$ applied to it. Windings A,B and C,D represent the quadrature windings of the resolver, while a rotating winding E,F is the sensor winding. When the physical angle $\theta$ of the sensor winding equals the electrical angle $\phi$, no voltage is induced in the sensor winding, but it is at all other positions. The polarity and amplitude of this signal depends on the difference between $\theta$ and $\phi$.

Figure 2:
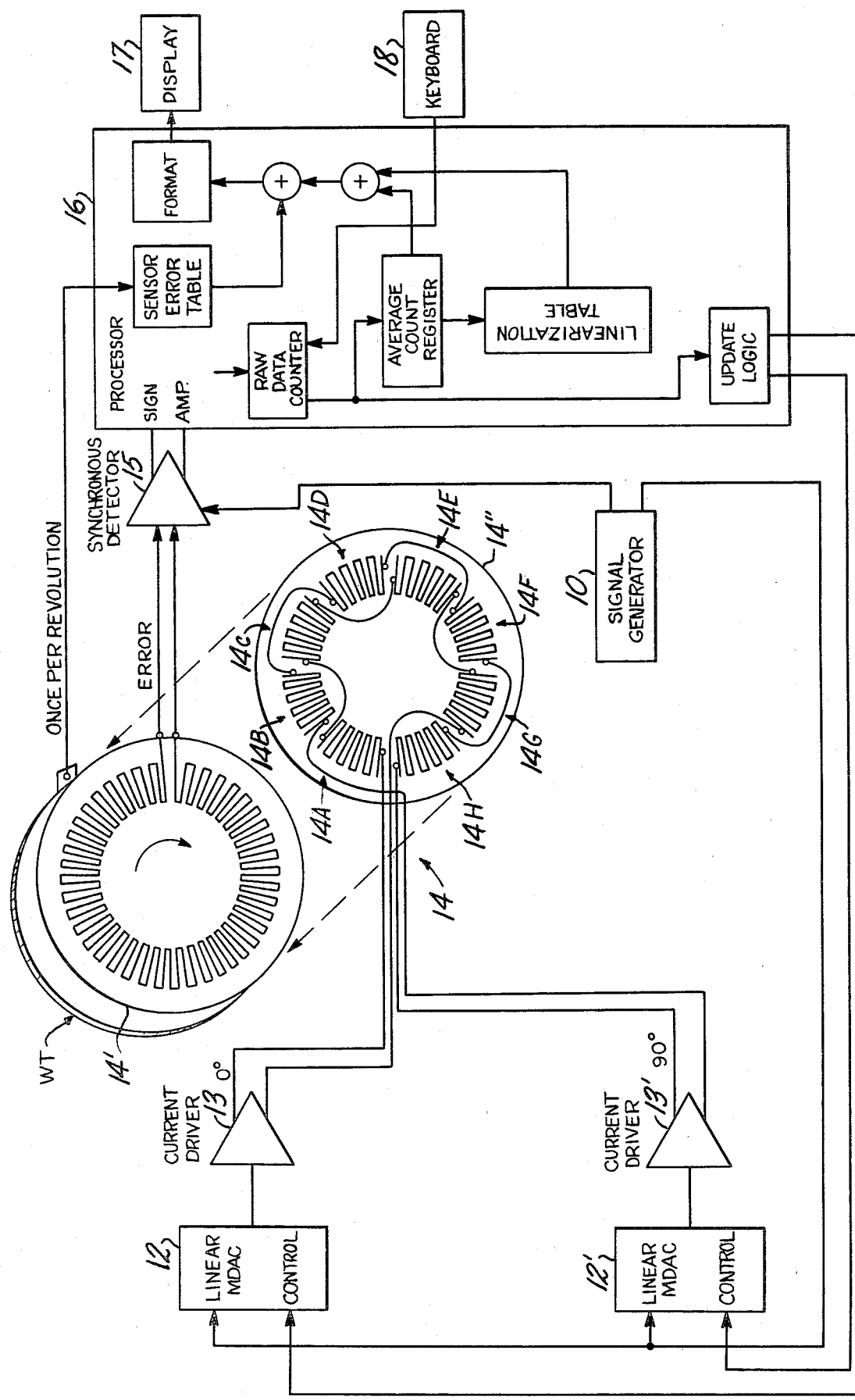
FIG. 2 is a block diagram of the circuit of the present invention.

In the present invention the single pole resolver of FIG. 1 is replaced by a 180 pole resolver 14, shown in schematic form in FIG. 2. The sensor winding 14, which rotates with the work table WT, is a continuous loop of radially disposed bars alternately connected at their opposite ends. The quadrature windings 14, however, are grouped in segments 14A–14H which are wired together. As shown in the drawing, alternate segments are wired together to form the two quadrature coils. This arrangement generates a one-turn coil which produces a field that results in inaccuracies. To correct this the segments may be cross wired in opposite directions so as to cancel out any such flux errors.

Every alternate group of segments represents the conductors of one quadrature winding, which is physically offset from the conductors of the adjacent groups that are for the other quadrature winding. In the present example the 180 poles divide the physical circle up into 2° arcs, each being further subdivided into 360° by the pole. As a result, the offset between groups is 90° electrically, but only $\frac{1}{2}$° of the physical arc of the circle. If the sensor winding conductors are aligned with the conductors of one group of quadrature windings, every alternate segment will also be aligned. The segments between the aligned ones will have the sensor conductors midway between their conductors, whereby the 90° spacial shift is achieved.

Figure 3:
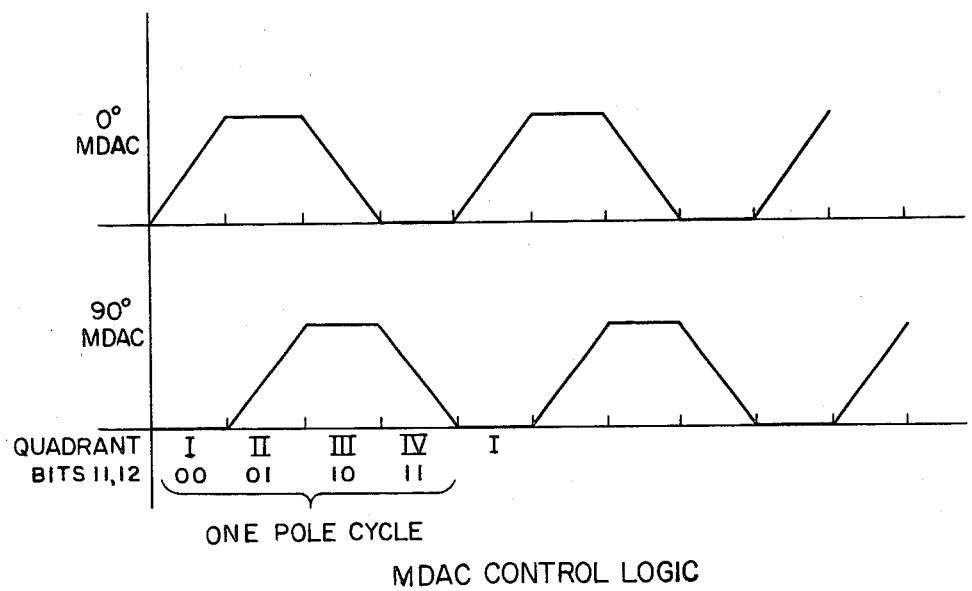
FIG. 3 is a graph of the trapezoidal logic control of the MDAC units.

The error signal from the multi-pole resolver is applied to a synchronous detector circuit 15 which determines its polarity and amplitude. These signals of polarity and amplitude are applied to the microprocessor, which updates a raw data counter or register in response thereto. In turn the counter activates update logic for controlling linear multiplying digital-to-analog converter (MDAC) units 12 and 12'. If the error is small, the microprocessor will increment the setting of one of the MDAC units by a particular amount. If the error is large, it will increment it by a larger amount. The MDAC unit which is incremented and the direction in which it moves depends upon the current position of the sensor within the pole cycle, i.e. the pole quadrant, as shown in FIG. 3. The effect of the MDAC is to change the amplitude of a signal from generator 10 before it is applied through current amplifiers 13,13' to the quadrature windings of the sensor. The frequency of the signal from generator 10 is in the range of 30 KHZ to 50 KHZ. Such a range assures good coupling in the resolver and reduces the amount of capacitive feedthrough of the signal in the MDAC units.

As shown in FIG. 3 the microprocessor controls the linear MDAC units according to a function that has the form of a trapezoid. This generates a stronger error signal and allows the logic circuitry to be simplier because changes are linear. Assuming that the system is at the 0° point, in the first quadrant of a pole, an error indicating movement of the sensor would cause the microprocessor to update the MDAC unit 12 while holding the control input to MDAC unit 12' constant. As soon as unit 12 had been incremented sufficiently to reach its maximum point, it is held constant at the maximum while MDAC unit 12' is incremented. When unit 12 has reached its maximum, unit 12 may be decremented while unit 12' is held at its maximum level. Thus it can be seen that sine-cosine MDAC units which are expensive and difficult to manufacture are eliminated by the simple expedient of updating the linear MDAC units according to a trapezoidal function.

Besides updating the MDAC units the microprocessor uses the raw data counter contents to create an average of the error signals in an internal average data counter or register. The average data register creates the signals for display of the position on display unit 17. However, since linear MDAC units are used and are controlled according to a trapezoidal function, the average count does not actually represent the angular position of the work table. Therefore, prior to displaying the data, it is linearized. This is accomplished by a linearization table contained in the microprocessor. This table has 64 selected points along a quadrant of a pole cycle, which points represent values to be added to the average count in order to compensate for the use of linear MDAC units operated according to a trapezoidal function, instead of using sine-cosine MDAC units. Linear interpolation is used to select values between the points of the table and the table values are reused for each of the other quadrants. Thus the appropriate value from the linearization table is added to the contents of the average data counter and the results are stored in a linearized data register.

In addition to linearization, the microprocessor may also add once-per-revolution corrections to the data to be displayed in order to compensate for manufacturing inaccuracies in the resolver. A table of inaccuracies is created for the particular resolver and is stored in the microprocessor memory at locations corresponding to its angular position. Then the contents of this table are added to the contents of the linearized data register and are stored in a corrected data register. Finally the data is converted into the desired format and stored in a display data register for display.

Initially, upon turning on the equipment, all of the counters and registers are reset to zero so that the position of the work table at the time power is applied is taken to be 0°. In the event that this initial position must be changed, a keyboard 18 is provided. The operation of the keys on the keyboard produce entries in a key status table, so that the microprocessor knows what keys have been pushed, and the data from the keyboard is loaded into a key input register. The difference between the key input data and the corrected data is then entered in an off set register whose contents are added to the corrected data register. The result of this addition is stored in a true data register. The format logic converts the contents of the true data register into data for degrees, minutes and seconds or degrees and thousandths. As previously mentioned this converted data is then stored in the display data register. Thus by generating the off set data from the keyboard, the display can be made to indicate the starting position of the work table as being any position inserted by the operator.

Figure 4:
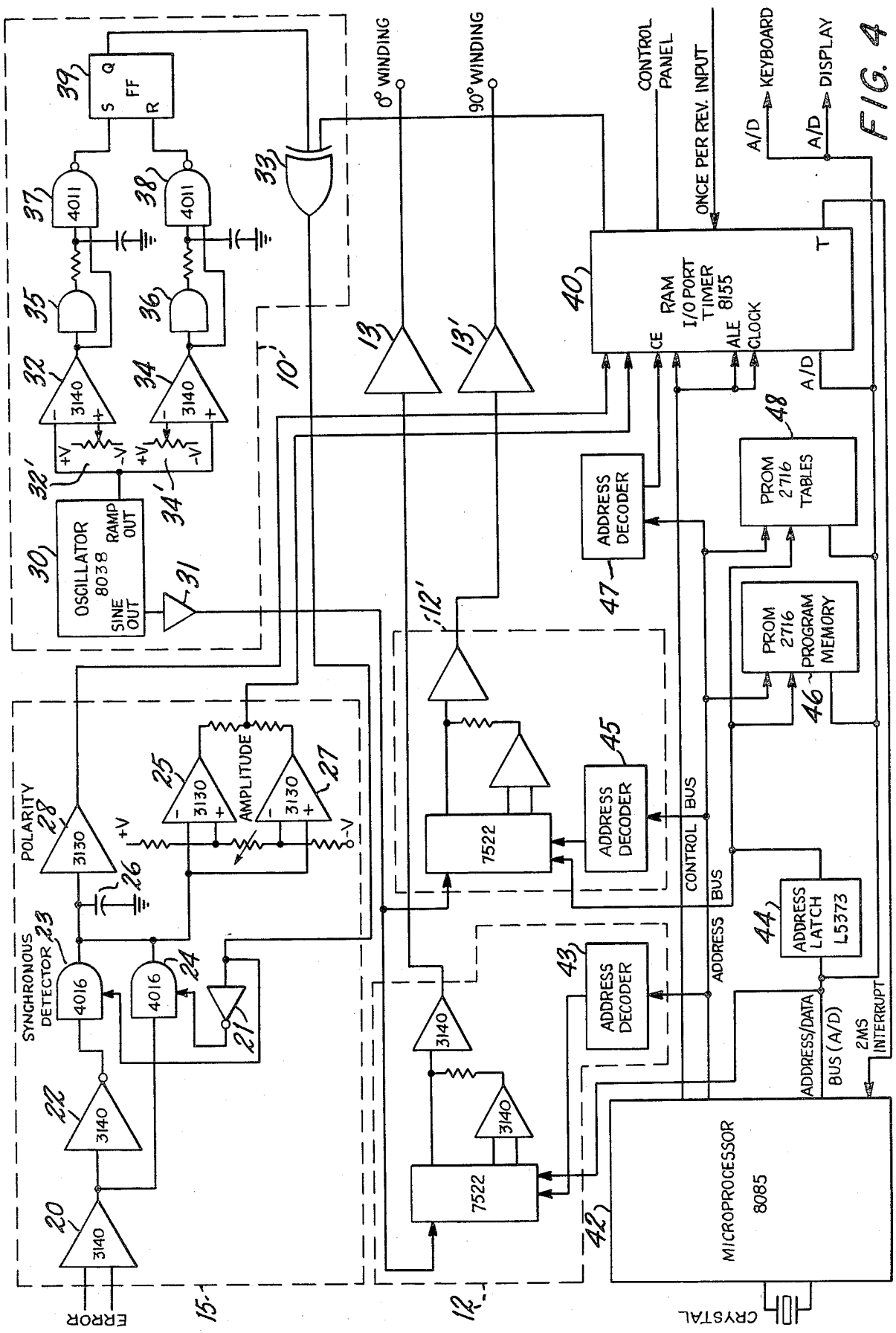
FIG. 4 is a schematic drawing of the circuits shown in FIG. 2.
Figure 5A:
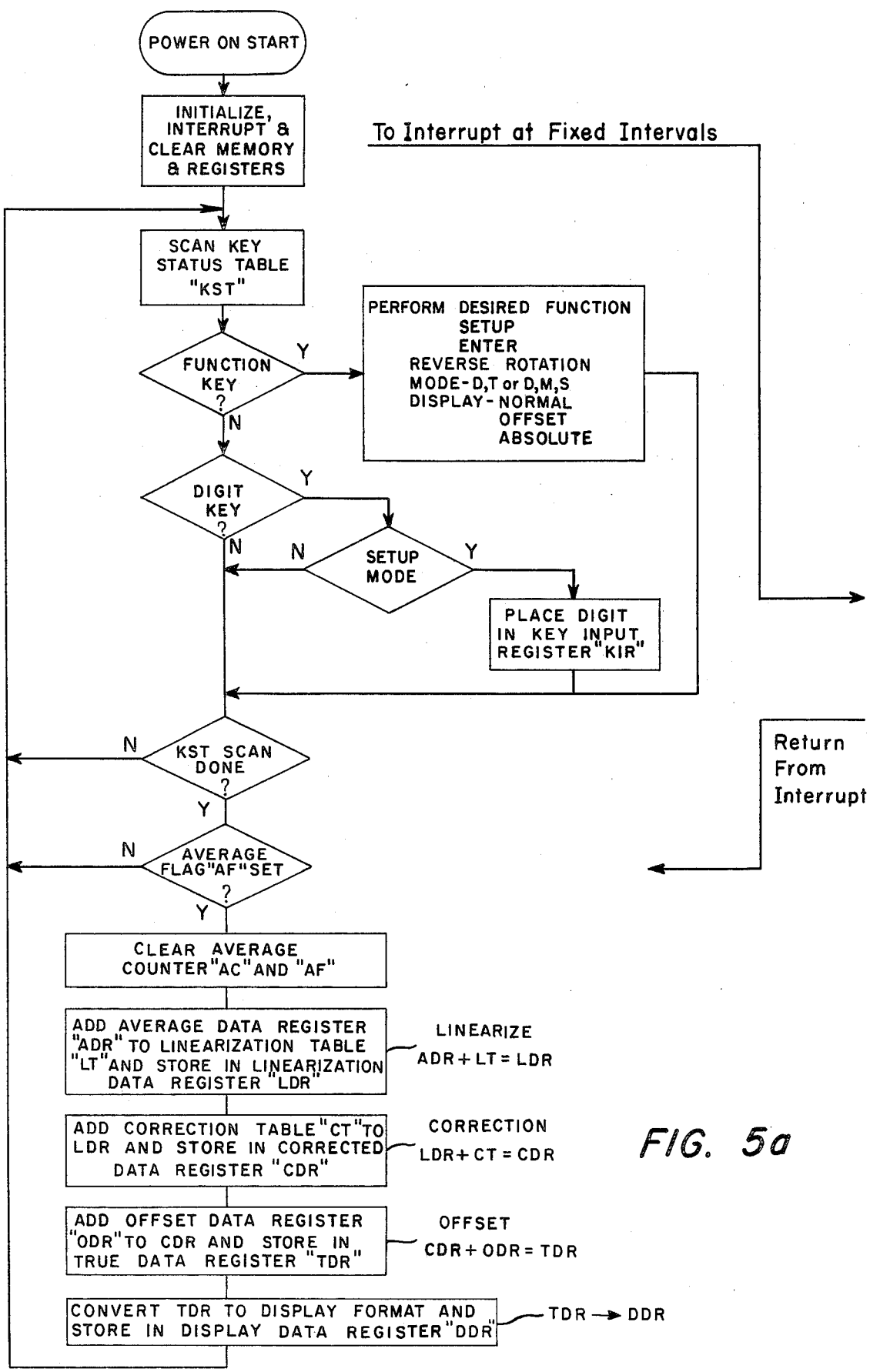
FIG. 5 is a flow chart of the operation of the microprocessor of FIG. 4.
Figure 5B:
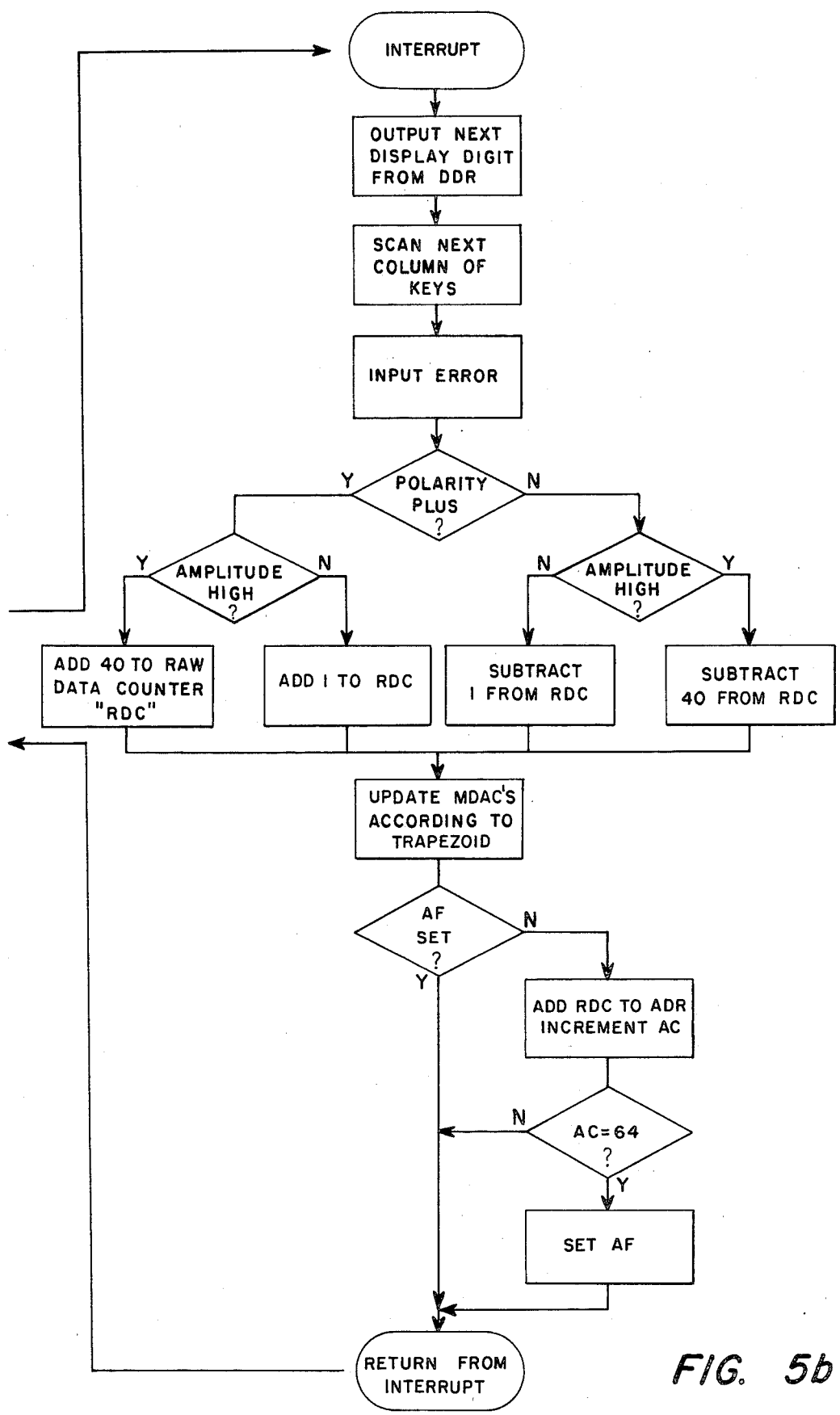

A circuit for carrying out the operation of the system of FIG. 2 is shown in the schematic drawing of FIG. 4 and a flow chart of the foregoing operations is shown in FIG. 5, wherein FIG. 5A shows data input and correction sequences, and FIG. 5B shows the error reduction and average count sequences. The various circuit elements shown in FIG. 4 are conventional integrated circuit units available from a variety of manufacturers. Some of the integrated circuits in FIG. 4 are identified by model numbers for illustrative purposes only.

The detector circuit 15 in FIG. 2 is shown in FIG. 4 to comprise an input amplifier 20 for receiving the error signal from the sensor winding of the resolver and an inverting amplifier 22. The inverted signal is supplied to a transmission gate 23, while the direct signal from amplifier 20 is supplied to transmission gate 24. Gates 23 and 24 are under the control of a signal generated from the signal generator circuit 10 (i.e. gate 33 of FIG. 4) such that in-phase excursions of the error signal and inverted out-of-phase excursions are applied through gates 24 and 23, respectively, for storage in a capacitor 26. Switching between these two signals is achieved with the use of the output of circuit 10, both in its direct form and in an inverted form created by inverter 21. Because of the gates 21, 23 and 24, capacitor 26 receives only signals which are at the frequency and phase shift determined by the signal generator circuit 10 which feeds the resolver. There is a need for a phase shift in this circuit because the error signal is slightly phase-shifted from the quadrature signals that generate it.

The signal generator circuit 10 includes an oscillator 30 which drives a buffer 31 with a sine wave signal. The output of buffer 31 is applied to the input of the MDAC units 12 and 12'. In addition oscillator 30 generates a ramp signal which is in-phase with the sine wave signal. This ramp is applied to level detectors 32 and 34, which are triggered when the ramp voltage crosses the level of the voltages set by resistors 32' and 34'. As a result, the outputs of these level detectors have the same frequency as the sine signal, but are phase-shifted by an amount depending on the setting of the adjusting resistors 32', 34'. These phase-shifted outputs are all converted into pulses by buffer circuits 35, 36 which have RC differentiating networks on their outputs. The pulses, as well as the signals from buffers 35, 36, are applied to NAND-gates 37 and 38, which trigger a flip-flop 39 to create the phase-shifted signal used in the synchronous detection circuits 23 and 24. Before being delivered to the detector, the signal is passed through Exclusive-Or gate 33 so as to allow the microprocessor to change its phase if necessary. As indicated, the phase shift is introduced into this signal because the proper error signal from the resolver has the frequency of the signal generator, but is slightly phase shifted, which phase shift is duplicated by the circuits 32 through 39.

The voltage, which has been detected and held in capacitor 26 has its polarity determined by amplifier 28. In addition the amplitude of the voltage, whether it be positive or negative, is determined in amplifiers 25 and 27. These amplifiers produce a high signal when the error is below a predetermined minimum and a low signal when it is above. The amplitude signal is used by the microprocessor to determine how much the raw data counter is incremented.

The polarity and amplitude indications from circuits 25, 27 and 28 are stored in circuit device 40. Device 40 is a combination logic unit, such as the model 8155 "RAM with I/O ports and timer," manufactured by Intel for use with microprocessor unit 42, which may be a model 8085 also manufactured by Intel. The unit 40 has three sections, a read-write memory section, input-output ports and a timer-counter section. The polarity and amplitude signals are merely applied to an input port of circuit 40.

A counter in unit 40 receives clock signals from the microprocessor and counts them so that an interrupt pulse T is generated on a periodic basis, for example, every two milliseconds. When the interrupt occurs, one of the digits of the display is updated, one column of keys of the keyboard is scanned, and the amplitude and polarity of the error signal is transferred from the input port to a register in microprocessor unit 42.

Microprocessor unit 42 is under the control of program memories stored in units 46,48. The contents of a 20 bit raw data counter, which is in unit 40, are also transferred to the microprocessor. The microprocessor determines which MDAC units should be updated, in which direction and by how much. This is done in accordance with the trapezoidal function shown in FIG. 3 based on the raw data count. Bits 1 to 10 set up a multiplication factor from 0/1024 to 1023/1024, bits 11 and 12 establish which quadrant (I, II, III, IV) of a pole the system is in, and bits 13–20 are a count of the number of poles that have been passed since the counter was reset. These bits 11 and 12 determine which MDAC unit is to be changed as shown in FIG. 3.

In an update of the raw data center is to occur, the new value is added to the present raw data count in the accumulator of the microprocessor. This value is then returned to the unit 40 and the bits 1–10 are also inserted on the address/data bus (A/D) for transmission to the MDAC units. In addition the address for the MDAC unit to be updated is generated on the address bus from bits 11 and 12 so that the new setting can be loaded from the A/D line into latches of the MDAC unit. Decoding of address information for the MDAC units is by means of address decoder units 43 and 45.

The MDAC units may be models 7522 manufactured by Analog Devices and equipped with operational amplifiers to allow them to have four quadrant capability, i.e. a plus and minus input signal from the signal generator results in a plus and minus signal in-phase or 180° out-of-phase, which signal is fed to drivers 13 and 13', respectively, for delivery to the quadrature windings of the resolver. The A/D bus of the microprocessor contains both address and data information for transmission throughout the system. The microprocessor indicates whether the signal is an address or data by means of the address strobe ALE. For circuits 45 through 48, which may require a constant address, the address from the microprocessor is loaded into address latch 44 where it will remain available for use by these circuits. When information is to be provided from the keyboard, or to the display, additional address decoders (not shown) are also activated from the microprocessor. The general operation of the microprocessor to carry out the error reduction sequence described is shown in the flow chart of FIG. 5B.

In order to generate appropriate display data, the operation shown in the flow chart of FIG. 5B must be followed. This operation also uses the raw data register in unit 40. The data is accumulated 64 different times at two millisecond intervals in the microprocessor and this is kept track of by an accumulator counter which sets an accumulate flag when the process is complete. On a one hundred and twenty-eight millisecond basis the sum is divided by 64 to obtain an average result in order to cancel errors caused by vibration and transient noise.

Using the average data which is stored in the average data register of unit 40, the microprocessor compares the average value with its linearization table of corrections, stored in memory 48, in order to linearize the outut signal. The correction is then added to the average signal to obtain a linearized signal stored in the linearized data register.

A once-per-revolution indicator from the sensor, which is supplied through unit 40, is used by the microprocessor to align the raw data counter with the absolute sensor position so that the sensor position will correlate with the correct entry in the correction table. This correction, also from a table in memory 48, is added to the linearized data signal to produce a corrected and linearized signal stored in the corrected data register of unit 40. Depending on a selection from the keyboard, the signal is then converted into a digital format for display in terms of degrees, minutes and seconds, or degrees and thousandths. During the two millisecond interrupt, a digit of the display is updated to show the current reading of this linearized, corrected and converted signal. If desired, and as previously indicated, the keyboard can also insert position data into the system, which data creates a difference information signal in the off set register. The contents of the off set register are added to the contents of the corrected data register and are stored in the true data register for conversion into the proper format.

Besides numeric keys for entering position data, the keyboard also contains several function switches. In particular SET UP and ENTER switches are used in conjunction with the numeric keys. The SET UP switch blocks operation of the numeric keys until it is activated. This prevents unintentional entries. Once the SET UP key has been operated, however, the display is cleared and the numeric keys become operational. When the ENTER key is depressed the data being displayed is transferred to the key input register of the system. This key also initiates the subtraction process between the input signal stored in the key input register and the present position signal stored in the corrected data register so that the off set register can be loaded. OFFSET DISPLAY and ABSOLUTE DISPLAY switches cause the display to show the off set and the corrected data without off set, respectively.

A MODE switch determines if the display is to be in degrees, minutes and seconds or in degrees and thousandths. This signal is applied to an input port of unit 40 and is used in the format logic control. Further a REVERSE ROTATION switch allows the turning of the table in one direction to be indicated on the display as an increasing or decreasing signal.

While the invention has been particularly shown and described with reference to a preferred embodiment thereof, it would be understood by those skilled in the art that various changes in form and details may be made therein without departing from the spirit and scope of the invention. In particular the correction for inherent sensor errors may be eliminated if the sensor has sufficient accuracy on its own. Also, the keyboard and microprocessor may be programmed to perform arthrimetic calculations that aid in machine tool operation, e.g. dividing a circle into a fixed number of parts. Further the apparatus of the invention may be incorporated into a numerical control machine which is automatically operated. The invention would prevent the machine from going on to a next step unless it indicates that a proper angular position has been reached. In a related application the invention could be included in the feedback loop of a servo motor driving the work table so that the table would automatically be set at a position determined by the operator from the keyboard. Finally if a printed output is included, the device could printout the precise angles or locations on a work piece as part of a parts inspection and verification procedure.

We claim:

1. Apparatus for measuring the rotation of a member, comprising:
   an angular error sensor means including a movable sensor element and at least one pair of elements forming at least one stationary arrangement, said stationary elements having a quadrature spaced relation to each other, said movable element being connected to said member for rotation therewith, said stationary quadrature elements being adapted to receive a first signal for one element and a second signal phase-shifted by 90° from the first signal for the other element, and said movable sensor element being adapted to produce an error signal based on the angular position of the movable element with respect to the stationary arrangement;
   detector means for detecting the polarity and amplitude of the error signals;
   processor means for accumulating the error signals in a raw data counter and applying a correction signal to the accumulated error signals in the raw data counter to form a linearized signal;
   display means for displaying the value of the corrected signal;
   signal generator means for creating an alternating current signal; and
   means for attenuating the alternating current to generate both the first and second reference signals, said means for attenuating being controlled by the value of the contents of the raw data counter of said processor means such that the error signal from the sensor means is driven toward zero.

2. Apparatus as claimed in claim 1 wherein the sensor means is a multiple pole resolver, the elements are windings of the resolver and the stationary arrangement is at least one pole of the resolver.

3. Apparatus as claimed in claim 2 wherein the resolver has 180 poles.

4. Apparatus as claimed in claims 2 or 3 wherein the stationary windings are in the form of cross-connected segments to reduce one-turn flux errors.

5. Apparatus as claimed in claims 1 or 2 wherein said detector means is a synchronous detector.

6. Apparatus as claimed in claims 1 or 2 wherein said processor is a microprocessor.

7. Apparatus as claimed in claim 1 or 2 wherein said means for attenuating are two linear multiplying digital to analog converters which are controlled according to a linear function by the processor.

8. Apparatus as claimed in claim 7 wherein said linear function is a trapezoid such that during two quarters of a cycle one converter is linearly increased or decreased in multiplying factor, while the other converter is held constant at a maximum or minimum level, and during the other two quarters of a cycle the other converter is linearly increased or decreased in multiplying factors while the one converter is held constant at a maximum or minimum level.

9. Apparatus as claimed in claims 1 or 2 wherein the accumulated error signals are averaged over a period of time to form an average value signal, the correction signal is from a linearization table of values chosen to compensate for driving the resolver with signals modulated according to a linear function instead of a sine function, and the correction signal is added to the average value signal to form the linearized signal.

10. Apparatus as claimed in claim 9 wherein the linearization table contains sixty-four values spread over one quadrant of operation and further including interpolation means for linearly interpolating between the sixty-four values and repeating the values for other quadrants.

11. Apparatus as claimed in claims 1 or 9 further including a table of sensor inherent correction values and means for adding the sensor correction values to the linearized signal, said sensor correction values being related to the inaccuracies manufactured into the resolver.

12. Apparatus as claimed in claim 1 wherein the member is a rotating work table of a machine tool.

13. Apparatus as claimed in claim 1 further including a keyboard means for inserting off set data into the display.

14. A method of measuring the rotation of a member comprising the steps of:
generating an error signal in a sensor means having a movable sensing element and quadrature spaced stationary elements;
detecting the amplitude and polarity of the error signal;
updating a raw data counter with the error signal in a direction determined by the polarity of the error signal and by an amount determined by the amplitude of the error signal;
generating a reference signal and applying it to two multiplier circuits;
controlling the multiplying factors of the two multiplying circuits in response to the contents of the raw data counter in a linear fashion so as to generate a first signal and a second signal which is phase shifted by 90° from the first; and
applying the first and second signals to the quadrature elements of said sensor means.

15. The method of claim 14 wherein the sensor means is a multiple pole resolver and the elements are windings of the resolver.

16. The method of claim 14 wherein the step of detecting the amplitude and polarity of the error signal is accomplished a synchronous detection based on a phase-shifted version of the reference signal.

17. The method of claim 14 further including the steps of
averaging the contents of the raw data counter over a period of time to obtain an average count,
applying a linearization correction to the average counts to obtain a linearized count compensated for driving the resolver with linear signals, and
displaying a true count, related to the linearized count, as the angular position of the member.

18. The method of claim 17 further including the step of applying an inherent sensor error correction to the linearized count to create a corrected count compensated for errors in the manufacture of the resolver, said true count being related to the corrected count.

19. The method of claims 14 or 18 further including the step of changing the format of the data prior to display in response to operator command.

20. The method of claims 14, 17, or 18 further including the steps of
generating a new position signal count from a keyboard,
subtracting the new position count from the corrected count to produce an off set count, and
adding the off set count to the corrected count to produce the true count.

* * * * *